United States Patent [19]

Harper et al.

[11] Patent Number: 4,983,806
[45] Date of Patent: Jan. 8, 1991

[54] METHOD AND DEVICE FOR COOLING ELECTRON BEAM GUN

[76] Inventors: James L. Harper; Charles H. Hill, both of 322 Lindberg Ave., Livermore, Calif. 94550

[21] Appl. No.: 487,595

[22] Filed: Mar. 1, 1990

[51] Int. Cl.⁵ ............................................. B23K 15/00
[52] U.S. Cl. ................................ 219/121.15; 118/726; 373/11
[58] Field of Search ............... 219/121.15, 121.12, 219/121.16, 121.17; 118/726; 373/11, 12

[56] References Cited

U.S. PATENT DOCUMENTS

| | | |
|---|---|---|
| 3,235,647 | 2/1966 | Hanks . |
| 3,420,977 | 1/1969 | Hanks . |
| 3,710,072 | 1/1973 | Shrader et al. . |
| 4,115,653 | 9/1978 | Kienely et al. ............... 118/726 X |
| 4,131,753 | 12/1978 | Tsujimoto et al. ............ 118/726 X |
| 4,728,722 | 3/1988 | Smith ........................ 219/121.16 |

Primary Examiner—C. L. Albritton
Attorney, Agent, or Firm—Limbach, Limbach & Sutton

[57] ABSTRACT

A device and method for cooling the edge of a top plate which partially surrounds an evaporant pocket in an electron beam gun. The invention involves the passage of coolant through a channel in the top plate. The channel is substantially parallel to and close enough to the edge of the top plate so that re-evaporation of evaporant condensed on the edge of the top plate is substantially prevented.

14 Claims, 3 Drawing Sheets

4,983,806

METHOD AND DEVICE FOR COOLING ELECTRON BEAM GUN

BACKGROUND OF THE INVENTION

The invention relates to electron beam coating systems. More particularly the invention relates to an improved system for cooling the top plate of a multi-pocket electron beam gun.

Electron beam guns have frequently been employed to evaporate material in a high vacuum environment for the purpose of ultimately depositing the material on a specific article or location. Such deposition systems typically include an electron emitting source, a crucible for holding the evaporant, and means for directing the electron beam onto the surface of the evaporant. Examples of such systems are described in U.S. Pat. Nos. 3,710,072, 3,235,647 and 3,420,977.

One important development in the electron beam coating art has been the development of rotatable tables containing multiple pockets for holding evaporants. A multi-pocket electron beam gun may be loaded at a single time to deliver different evaporant materials. The gun is set up to deliver different evaporant materials by simply rotating the table in which the multiple pockets are contained. The multi-pocket electron beam gun design also provides increased capacity over the conventional single pocket design.

A necessary element of the multi-pocket electron beam gun is a top plate cover for the table, which allows only one pocket at a time to be exposed to the sweeping electron beam. Usually the top plate has a hole or cut-out section dimensioned to allow exposure of a single pocket. The top plate edge adjacent to the cut-out section, the "inward edge", is inherently susceptible to excessive heating because of it proximal location to the electron beam target.

A common problem with the multi-pocket electron beam gun is that evaporant collects on the inward edge and later re-evaporates contaminating the item to be coated.

In a prior device, inventors have attempted to minimize the problem by causing coolant to flow through a straight channel which runs longitudinally through the top plate of the electron beam gun. See FIG. 2. The straight cooling channel, however, inadequately cools portions of the top plate distal from the channel.

It has been discovered that a primary cause of the contamination problem is that the top plate edge adjacent to the exposed evaporant pocket inherently becomes coated with evaporant because of its close proximity to the evaporant pocket. In subsequent use the coated edge of the top plate becomes hot from secondary electron bombardment and from heat emanating from the evaporant reservoir, causing the evaporant to re-evaporate finally condensing on and contaminating the item which is intended to be coated exclusively with material from the exposed pocket.

Another problem related to excessive heating of the top plate edge is that the heat causes the condensed evaporant to fuse to the plate, making it difficult to clean.

Another problem is that excessive heating of the top plate edge causes it to warp.

SUMMARY OF THE INVENTION

An object of this invention is to decrease the re-evaporation of condensed evaporant which collects on the inward edge of the top plate in an electron beam gun.

A related object of the invention is to decrease contamination caused by re-evaporation of evaporant from the inward edge of the top plate which subsequently condenses on the item to be coated.

Another object of the present invention is to make it easier to remove condensed material which collects on the edge of the top plate in an electron beam gun.

The above objectives are accomplished in an electron beam gun by passing coolant through a channel which follows a path adjacent to and substantially parallel to the inward edge of a top plate which partially surrounds a pocket of evaporant.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE INVENTION

Figure 1:
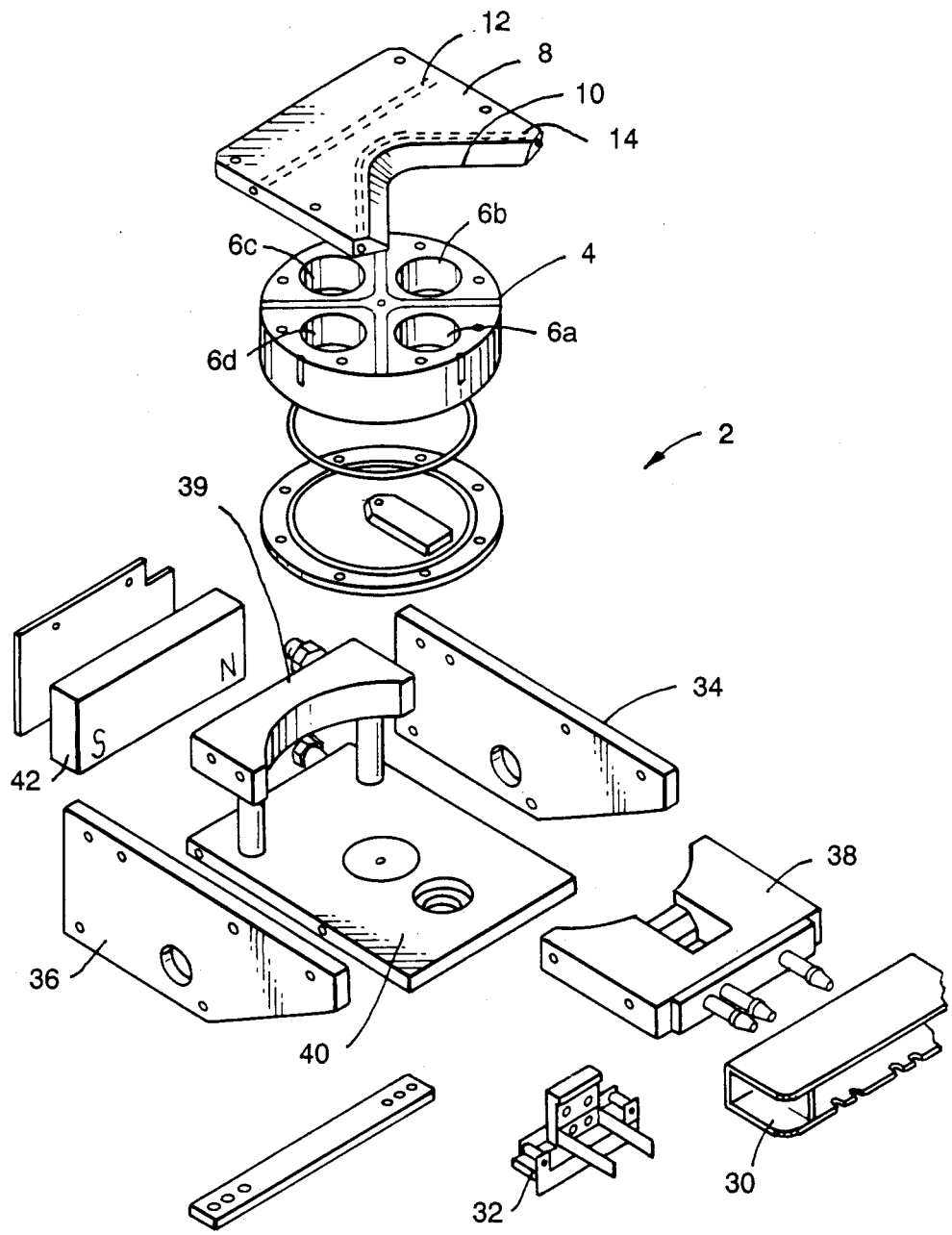
FIG. 1 is an exploded perspective view of a multi-pocket electron beam gun assembly of the present invention.

FIG. 1 shows the primary parts of a multi-pocket electron beam gun. Main body parts 38, 39 and 40 are flanked by magnet pole pieces 34 and 36. A permanent magnet 42 is attached to the back of the main body between the pole pieces 34 and 36. An emitter 32 and electro shield 30 are connected towards the front of the main body. The main body is adapted to receive a rotatable table 4. The table 4 may have any number of pockets for holding evaporants. The table 4 in FIG. 1 has four pockets 6a, 6b, 6c and 6d.

Top plate 8 has a V-shaped inward edge 10 adapted to partially surround and upwardly expose one pocket 6a while covering the other pockets 6b, 6c and 6d. In any other embodiments the size and shape of the inward edge will vary to compliment the number, size and shapes of the pockets contained in the table, the goal always being to allow upward exposure of only one pocket at a time.

Figure 2:
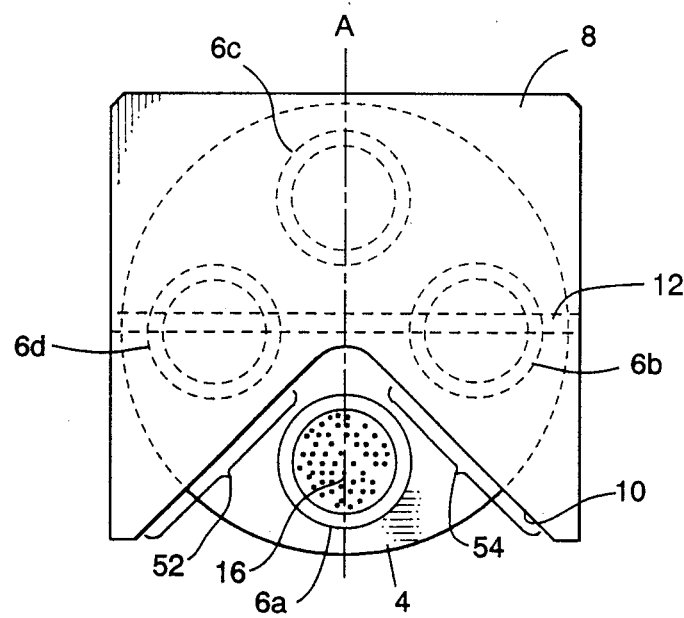
FIG. 2 is a top view of the table and top plate portions of the prior art.
Figure 3:
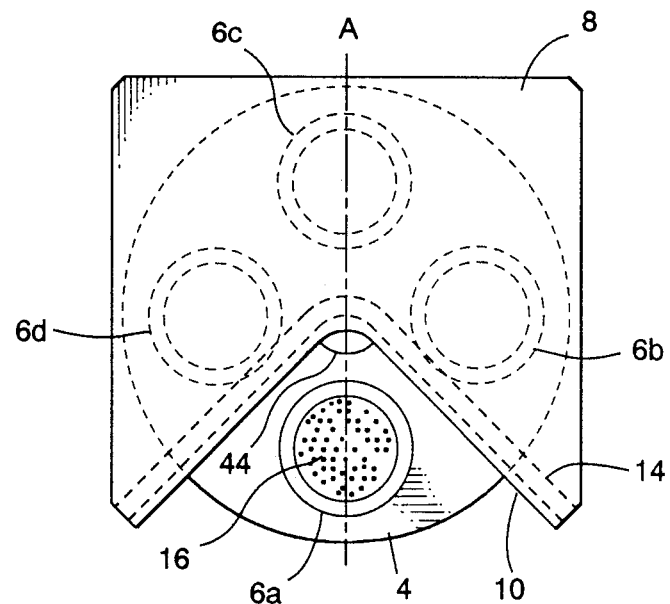
FIG. 3 is a top view of the table and top plate portions of one embodiment of the present invention.
Figure 4:
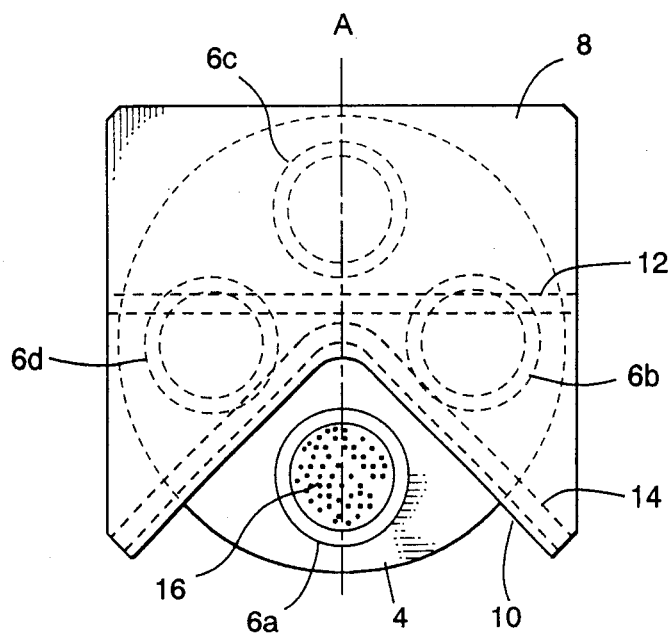
FIG. 4 is a top view of the table and top plate portions of another embodiment of the present invention.

A sweeping electron beam is directed onto the surface of evaporant 16 contained in pocket 6a in table 4 in FIG. 2, FIG. 3 and FIG. 4. Inward edge 10 of top plate 8 becomes hot caused by heat emanating from evaporant 16 and by secondary electron bombardment. This causes condensed evaporant to re-evaporate off of the inward edge 10 leading to contamination of the item to be coated. The heat also causes evaporant to fuse to top plate 8 making it difficult to clean. The heat also causes top plate 8 to warp.

FIG. 2 shows a method employed in the prior art to cool top plate 8. Top plate 8 in FIG. 2 is evenly split by axis A1 which also splits inward edge 10 into two equal parts. Coolant is passed through a straight coolant channel 12 which is longitudinal (in the plane of top plate 8)

and perpendicular to axis A1. The problem with this design is that it fails to adequately cool distal portions 52, 54 of inward edge 10 of top plate 8.

FIG. 3 shows one embodiment of the improved cooling system of the present invention. In the device shown in FIG. 3 coolant is passed through coolant channel 14 in top plate 8. Coolant channel 14 runs substantially parallel to inward edge 10 of top plate 8 forming right angle 44. The FIG. 3 cooling system is superior to the prior art because it focuses on the part of top plate 8 closest to evaporant pool 16, the electron beam target area.

FIG. 4 shows a another embodiment which combines the prior art straight coolant channel 12 and the improved coolant channel 14 to provide greater total cooling capacity for top plate 8.

The invention would be useful in single pocket electron beam guns as well. The principles described herein apply to any device having a plate edge partially or totally surrounding an evaporant pocket which is bombarded by electrons. Such an edge will inherently tend to collect evaporant, which upon subsequent use will re-evaporate if the plate edge is not adequately cooled.

Although the present invention has been shown and described with respect to preferred embodiments, various changes and modifications which are obvious to a person skilled in the art to which the invention pertains are deemed to lie within the spirit and scope of the invention.

What is claimed is:

1. In an electron beam gun having a rotatable table partially covered by a top plate, said table having a plurality of evaporant pockets, said top plate having an inward edge partially surrounding a first of said pockets, so that said first pocket is upwardly exposed while the other pockets are covered, wherein the improvement comprises:
   a stream of coolant, said top plate having a channel for passing said coolant, said channel running longitudinally through said top plate adjacent and substantially parallel to said inward edge of said top plate, whereby said inward edge of said top plate is cooled by said coolant.

2. The electron beam gun according to claim 1 wherein said channel is substantially V-shaped.

3. The electron beam gun according to claim 2 wherein said table has 4 evaporant reservoirs.

4. The electron beam gun according to claim 3 wherein said V-shaped channel forms a right angle.

5. The electron beam gun according to claim 1 wherein said channel is close enough to said inward edge of said top plate to cool said inward edge sufficiently to prevent re-evaporation of evaporant which condenses on said inward edge.

6. A process for cooling a top plate which covers an evaporant table in an electron beam gun, said table having a plurality of evaporant pockets, said top plate having an inward edge partially surrounding a first of said pockets allowing said first pocket to be upwardly exposed while the other pockets are covered, comprising the step of:
   passing coolant through a channel in said top plate, said channel running longitudinally through said top plate adjacent and substantially parallel to said inward edge of said top plate.

7. The method according to claim 6 wherein said channel in said top plate is substantially V-shaped.

8. The method according to claim 7 wherein said V-shaped inward edge forms a right angle.

9. In an electron beam gun having a plate edge partially surrounding an evaporant pocket, wherein the improvement comprises:
   a stream of coolant, said plate having a channel substantially parallel to said plate edge.

10. The electron beam gun according to claim 9 wherein the capacity of said channel and the proximal relationship of said channel to said plate edge are sufficient in combination to cool said plate edge enough to substantially prevent re-evaporation of evaporant previously condensed on said plate edge.

11. A device for coating an object with material comprising:
    a means for producing a sweeping electron beam;
    a table having a first pocket for holding said material so that a surface of said material is upwardly exposed, said electron beam being directed at said surface of said material;
    a plate having an edge partially surrounding said first pocket,, said plate having a first channel running longitudinally and substantially parallel to said edge;
    a first coolant stream passing through said first channel of said plate for cooling said edge, whereby re-evaporation of material off of said edge is substantially prevented.

12. The device according to claim 11 wherein said first channel and associated plate edge are substantially V-shaped.

13. The device according to claim 12 wherein said table has a plurality of pockets, said top plate being adapted to allow electron beam exposure to said pockets one at a time within said V-shaped edge of said top plate.

14. The device according to claim 11 further comprising:
    a second coolant stream, said top plate containing a longitudinal axis which passes through the center of said inward edge, said top plate having a second channel running perpendicular to said axis, said second coolant stream passing through said second channel.

* * * * *